United States Patent [19]
Wang et al.

[11] Patent Number: 6,157,562
[45] Date of Patent: Dec. 5, 2000

[54] ROM WITH FOUR-PHASE DYNAMIC CIRCUITS

[75] Inventors: Jinn-Shyan Wang, Chia-Yi Hsien; Ching-Rong Chang, Keelung, both of Taiwan

[73] Assignee: National Science Council of Republic of China, Taipei, Taiwan

[21] Appl. No.: 09/209,760

[22] Filed: Dec. 11, 1998

[51] Int. Cl.[7] .................................................. G11C 17/00
[52] U.S. Cl. ............................... 365/94; 365/203; 326/98
[58] Field of Search ....................... 365/94, 203; 326/93, 326/98

[56] References Cited

U.S. PATENT DOCUMENTS

| | | | |
|---|---|---|---|
| 5,378,942 | 1/1995 | Wu et al. ................................. | 326/97 |
| 5,815,005 | 9/1998 | Bosshart .................................. | 326/95 |
| 5,867,036 | 2/1999 | Rajsuman ................................ | 326/16 |

*Primary Examiner*—David Nelms
*Assistant Examiner*—Hoai N. Ho
*Attorney, Agent, or Firm*—Smith, Gambrell & Russell, LLP

[57] ABSTRACT

The invention relates to a ROM with four-phase dynamic circuits, featuring at a concept of four-phase operation by fusing and combining pseudo-domino dynamic circuits as well as skill of HS-PDCMOS dynamic circuits. Meanwhile, the invention has improved HS-PDCMOS concept circuit for use in a ROM. Analysis and simulation reveal that the invention is advantageous not only in keeping a compact circuit area but also in evaluation speed and in reducing power dissipation for a ROM.

2 Claims, 9 Drawing Sheets

(1)

(2)

| Unit\Time | T0 | T1 | T2 | T3 | T4 | T5 | T6 | T7 | T8 |
|---|---|---|---|---|---|---|---|---|---|
| Row Decoder | D/H | P | E | D/H | D/H | P | E | D/H | D/H |
| Cell Array | E | D/H | D/H | P | E | D/H | D/H | P | E |
| Column Decoder | D/H | P | E | D/H | D/H | P | E | D/H | D/H |
| Output Latch | E | L | | | E | L | | | E |

P: precharge  E: evaluation  D/H: discharge/hold  L: latch

Address line $a_i$ ; i=1,2,...

ROM WITH FOUR-PHASE DYNAMIC CIRCUITS

BACKGROUND OF THE INVENTION

The invention relates to a ROM with four-phase dynamic circuits and, more particularly, to a ROM with four-phase dynamic circuits constructed by availing a four-phase operation concept fused with skill of pseudo-domino circuits and HS-PDCMOS dynamic circuits, which may be applied in high speed read only memory (HS ROM), high density read only memory (HD ROM) and embedded read only memory (embedded ROM). Moreover, owing that it's an improvement in circuit construction method, the invention may be applied in electrically-controlled read only memory (For example, EPROM, $E^2$PROM, Flash ROM, etc.).

A decent construction and a memory cell structure of a ROM circuit are usually designed to meet product requirements in electrical characteristics and cost. The basic logic style of a memory cell array may be classified as of NAND/AOI [4] [12–17] [19–20] [21–28] and NOR [5–11], wherein the latter is commonly applied for a high speed ROM, while the former for a middle or low speed ROM at high capacity respectively.

The chip area is a key factor concerning cost of chip fabrication; the larger the chip area, the higher the cost. So as to minimize the area, the memory cell array of a NAND/AOI logic style is normally applied for designing a ROM. However, on the contrary, owing to a plurality of cascade N type transistors used in the memory cell array of the NAND/AOI logic style, the operation speed of the ROM is bound to be slowed down.

FIG. 1 is a block diagram showing a reading process of either a masked or an electrical ROM. In general, memory cells are arranged in an array (B), and during a reading process, an address bus sends address to input terminal of an address buffer (D). The output from the buffer (D) are splitted into: m lines feeding a row decoder (A) to provide row address, n lines feeding a column decoder (C) to provide column address. The selected data are then sent to a data bus via an output buffer (E). Besides, a clock signal is employed to assure synchronous action of the ROM to the system circuit.

Skill of dynamic circuits is used frequently to improve circuit performance for minimizing circuit area and increasing operation speed in a CMOS circuit design. FIG. 2A is a schematic view of partial circuit (critical path shown only) of a ROM [14] using conventional MOS dynamic circuits and logic style of AOI memory cell array (Including a row decoder 11, memory cell array 12, column decoder 14 and output latch 13). Assuming the CMOS fabricating technology is applied to design an AOI-type mask ROM, then, this design shall require enhancement NMOS' depletion NMOS' and/or enhancement PMOS transistors, wherein the depletion NMOS transistor is only used in the memory cell array for coding purpose. In the case of designing an $E^2$PROM, the related $E^2$PROM elements shall be utilized in the memory cell array, namely, the NMOS transistors have to be replaced by those for $E^2$PROM, which are programmable to create a high or low device threshold voltage (Vt). In such kind of conventional dynamic circuits in a ROM and due to domino effect [2], there is only one clock signal line CK required for the integral circuit, as shown by upper waveform in FIG. 2B. When CK=0 (logic low), the circuit is proceeding precharge [2], while CK=1 (logic high), the circuit is to evaluate in a sequential order of row/column decoder-memory cell array-output latch. Under normal conditions, time required for evaluation is always longer than precharge. In other words, time of evaluation limits the operation speed of a ROM. If we design a clock with shorter precharge time, the performance of the ROM could be improved. The lower waveform in FIG. 2B indicates a clock with shorter precharge time.

In an AOI-type mask ROM, a plurality of cascade N type transistors are arranged in the memory cell array as shown in FIG. 2A, which is the main factor delaying evaluation of a ROM. If shortcomings of this portion could be improved, the operation of the integral circuit would be speeded up undoubtedly.

SUMMARY OF THE INVENTION

The invention combines a concept of four-phase operation, pseudo-domino dynamic circuits and HS-PDCMOS dynamic circuits to form a ROM with four-phase dynamic circuits.

First of all, if we avail ourselves of the HS-PDCMOS [3] [18] concept and with a CMOS latch, a ROM with dynamic circuits may be designed as shown in FIG. 3A, comprising a row decoder 21, a memory cell array 22, an output latch 23, and a column decoder 24. FIG. 3B indicates the related timing control and circuit status. Such a circuit does improve working speed to some extent, however, due to overuse of HS-PDCMOS logic circuits [3] except output latch, more control circuits would be required than a conventional dynamic circuit to not only increase fabricating cost but also create problems in pitch matching.

In view of the imperfection of the prior skills, the invention of a ROM with four-phase dynamic circuits has the following advantages:

1. An (improved) HS-PDCMOS concept is applied in circuits to the entire memory cell array to maintain at a high working speed even when a larger number of cascade transistors are employed in the memory cell array.
2. An (improved) HS-PDCMOS concept is applied in circuits to the entire memory cell array and by favor of its output stage, a high stability of output data is obtainable.
3. By using the pseudo-domino dynamic circuits in decoders, the timing control can be further simplified, and the pitch matching of layout between the decoders and the memory cell array can be enhanced too.
4. Owing to usage of AOI logic style for the memory cell array, to minimize the circuitry area of the ROM is possible.
5. As the in-line working speed of the invention is considerably high, it could still meet spec. increasing the number of cascade transistors, the area whereof may be reduced to cut down cost and raise yield accordingly.

BRIEF DESCRIPTION OF THE DRAWINGS

The drawings disclose an illustrative embodiment of the present invention, which serves to exemplify the various advantages and objects hereof, and are as follows.

DETAILED DESCRIPTION OF THE PREFERRED EMBODIMENT

Figure 4A:
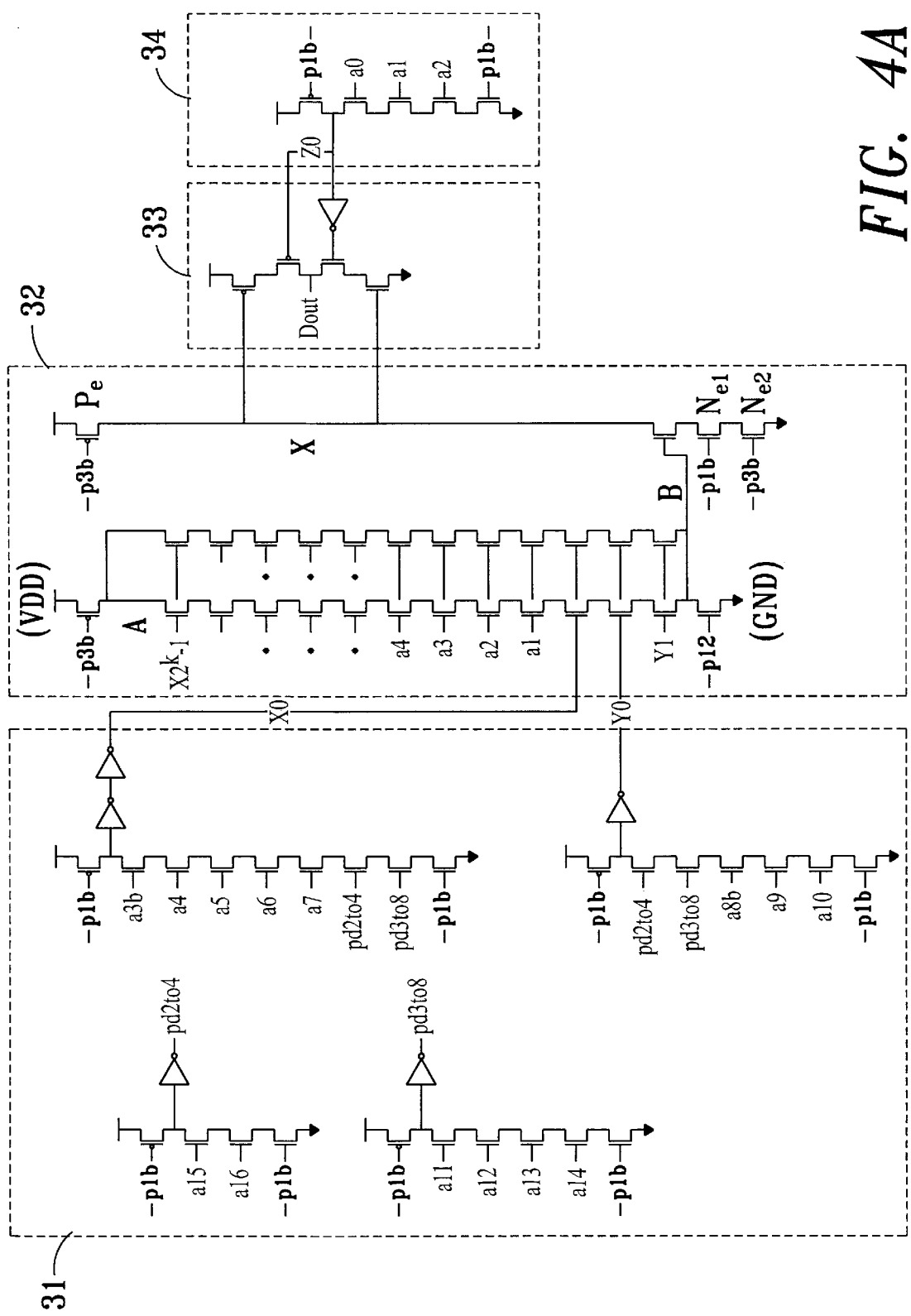
FIG. 4A shows a schematic structure of circuit 1 of the invention.
Figure 4B:
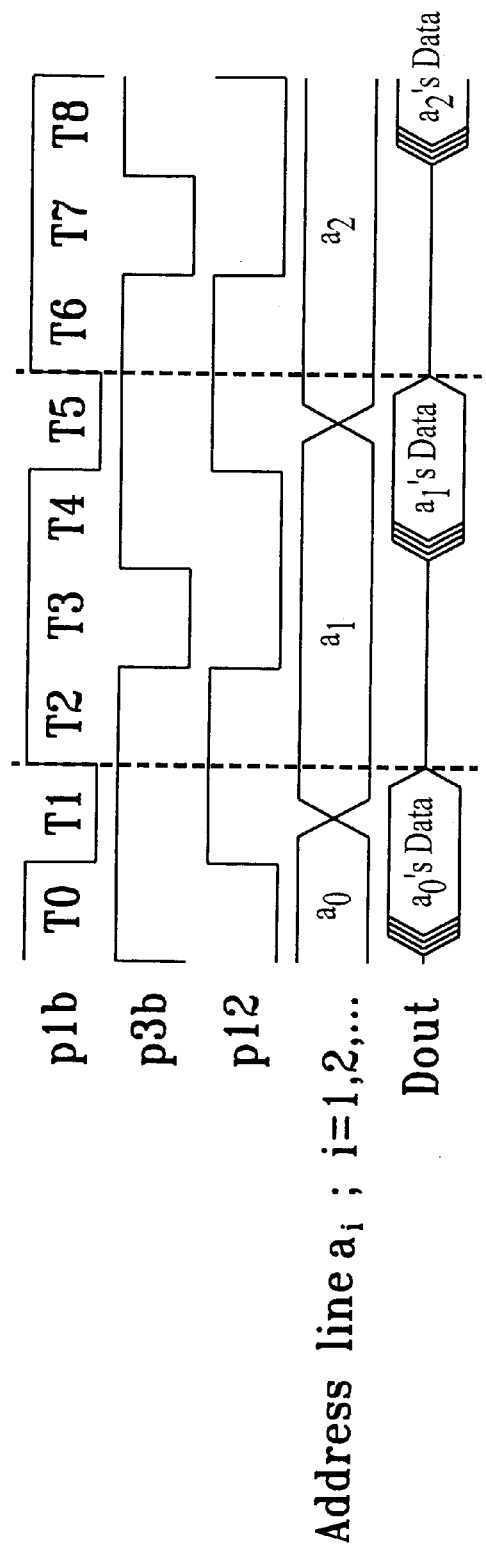
FIG. 4B shows a status table of circuit operation and waveforms of related timing control of circuit 1 of the invention.

As for increasing integrating density of a memory cell array, an AOI logic style is usually adopted for designing a memory cell array, wherein the AOI-type ROM may be formed to couple several strings in parallel containing a plurality of cascade N type transistors each. Meanwhile, in order to reduce power dissipation, we are to divide a row decoder into stages, and to add a concept of blocking to form a multi-block, multi-stage decoder, wherein only the related decoding block and unit memory cell(s) will act when evaluating. This arrangement reveals a lesser cascade N type transistors in the decoders than that in the memory cell array, or operation speed of the former is quicker than the latter. After all, our thinking is to employ pseudo-domino dynamic circuits accompanying a proper timing control to substitute HS-PDCMOS circuits for building up the row and column decoders, and to keep HS-PDCMOS circuits only for the memory cell array to form the circuit shown in FIG. 4A, wherein the row decoder 31, the memory cell array 32, the output latch 33 and the column decoder 34 are included. The changes made as described can reduce area of the decoders, increase pitch matching of layout for the decoders and the memory cell array, lessen power dissipation, and simplify the timing control from 4 lines to 3. This is circuit 1 of the invention, whereof a status table of circuit operation and related waveforms of timing control are shown in FIG. 4B. The relevant operation principle is depicted in the following:

(a) During time interval T1, p1b=0 (logic low), decoders under precharge (P) state, new address lines (a$_i$) being stable before end of a clock period; p3b=1 (logic high), p12=1, VDD to A OFF, voltage at B=0V, Pe at PMOS and Ne1 at NMOS OFF, node X at output stage of the memory cell array keeping floating to hold data obtained in last period; the memory cell array being under discharge/hold state.

(b) During time interval T2, p1b=1 (logic high), decoders starting evaluation; the memory cell array still keeping under discharge/hold state; assuming word line X0 and Y0 selected by row decoder, data line Z0 by column decoder.

(c) During time interval T3, p3b=0, p12=0, all paths from the memory cell array to ground OFF, the output node X being precharged to VDD, known as precharge interval; decoders keeping X0, Y0 and Z0 without change.

(d) During time interval T4, p1b=1, p3b=1, p12=0, the memory cell array under evaluation; Pe OFF, Ne1 and Ne2 ON, logic value of output node X depending on that of B; decoders keeping original address and providing stable word lines/data lines; the chosen value of a unit memory cell being passed to Dout.

(e) When entering time interval T5, p1b=0, decoders coming back to precharge state, the output value latched to avoid changing effect of address lines, while the memory cell array returning to discharge/hold state.

To repeat the procedure in sequence of (a), (b), (c), (d) is the four-phase action mode, and due to the application of the HS-PDCMOS circuit principle, an improvement in reading speed of a ROM is expectable.

Figure 5A:
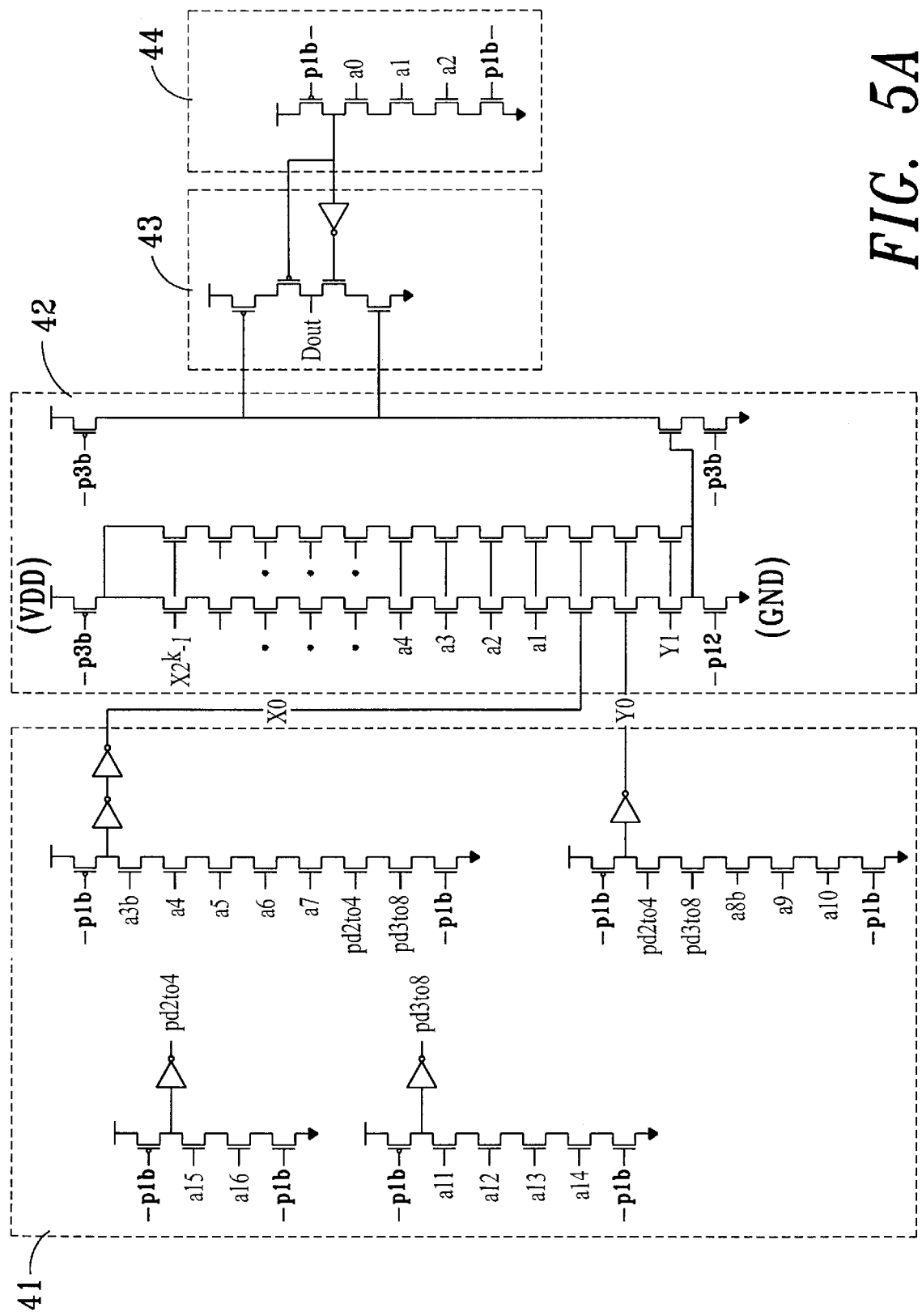
FIG. 5A shows a schematic structure of circuit 2 of the invention.
Figure 5B:
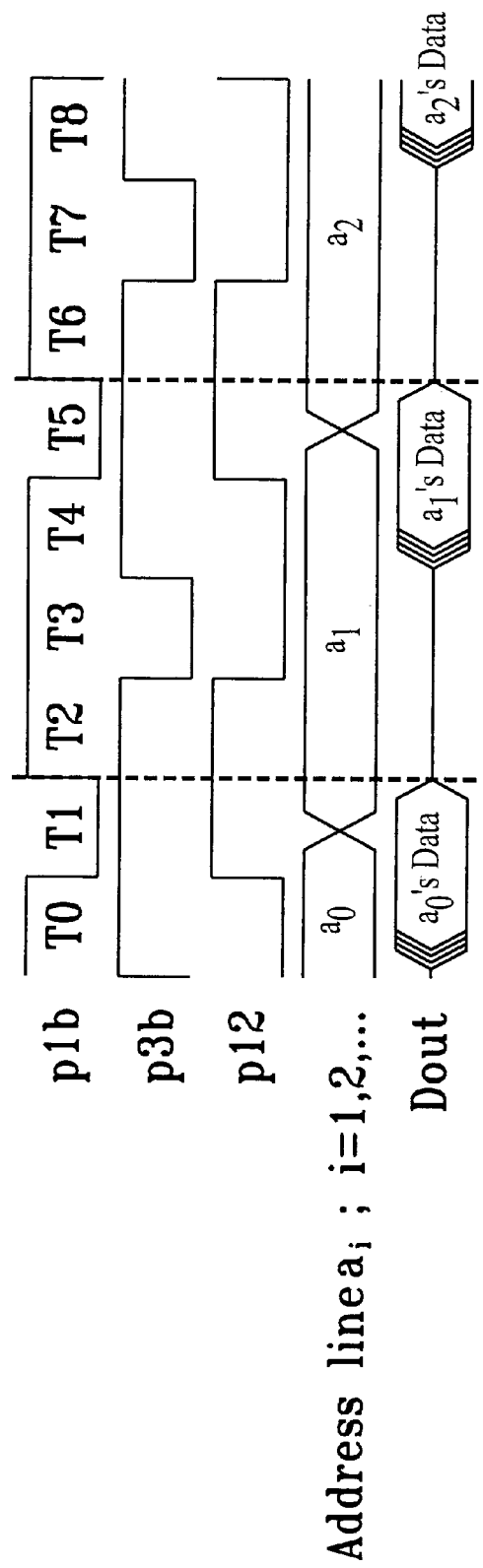
FIG. 5B shows a status table of circuit operation and waveforms of related timing control of circuit 2 of the invention.

With respect to above said circuit 1 of the invention, the evaluation time may be further improved. As the number of cascade N type transistors at output stage will affect the operation speed of the memory cell array (3 cascade N type transistors arranged at output stage of the memory cell array shown in FIG. 4A), it looks feasible to contract length of the circuit by removing one of them, say the Ne1 transistor in this case. The result shows that removal of Ne1 transistor does not bring any bad influence to the circuit performance. The simplified output stage of memory cell array of circuit 1 operates under a single control signal can avoid DC power dissipation, which conforms to the above-mentioned improved HS-PDCMOS concept. This circuit may be further commensurate with pseudo-domino circuits to form circuit 2 of the invention as shown in FIG. 5A, wherein a row decoder 41, a memory cell array 42, an output latch 43, and a column decoder 44 are included. The operation mode of circuit 2 is the same with circuit 1, and FIG. 5B shows circuit operation status and waveforms of timing control of the former.

The arrangement of two cascade NMOS transistors at output stage has been mentioned too in a HS-PDCMOS paper [3], wherein each of two different control signals is used for precharge and evaluation at output stage of the memory cell array of the decoders respectively, and thereby undesirable DC power dissipation may incur. In FIG. 4A, the p1b controlled Ne1 transistor can get rid of data race during precharge in the prior stage, while the p3b controlled Ne2 transistor has an energy saving advantage according to our analysis. Since a ROM is a kind of full custom design, a timing clock can be properly controlled, hence, in our proposed circuit, Ne1 transistor is deemed omissible, while Ne2 is kept for energy saving.

Figure 1:
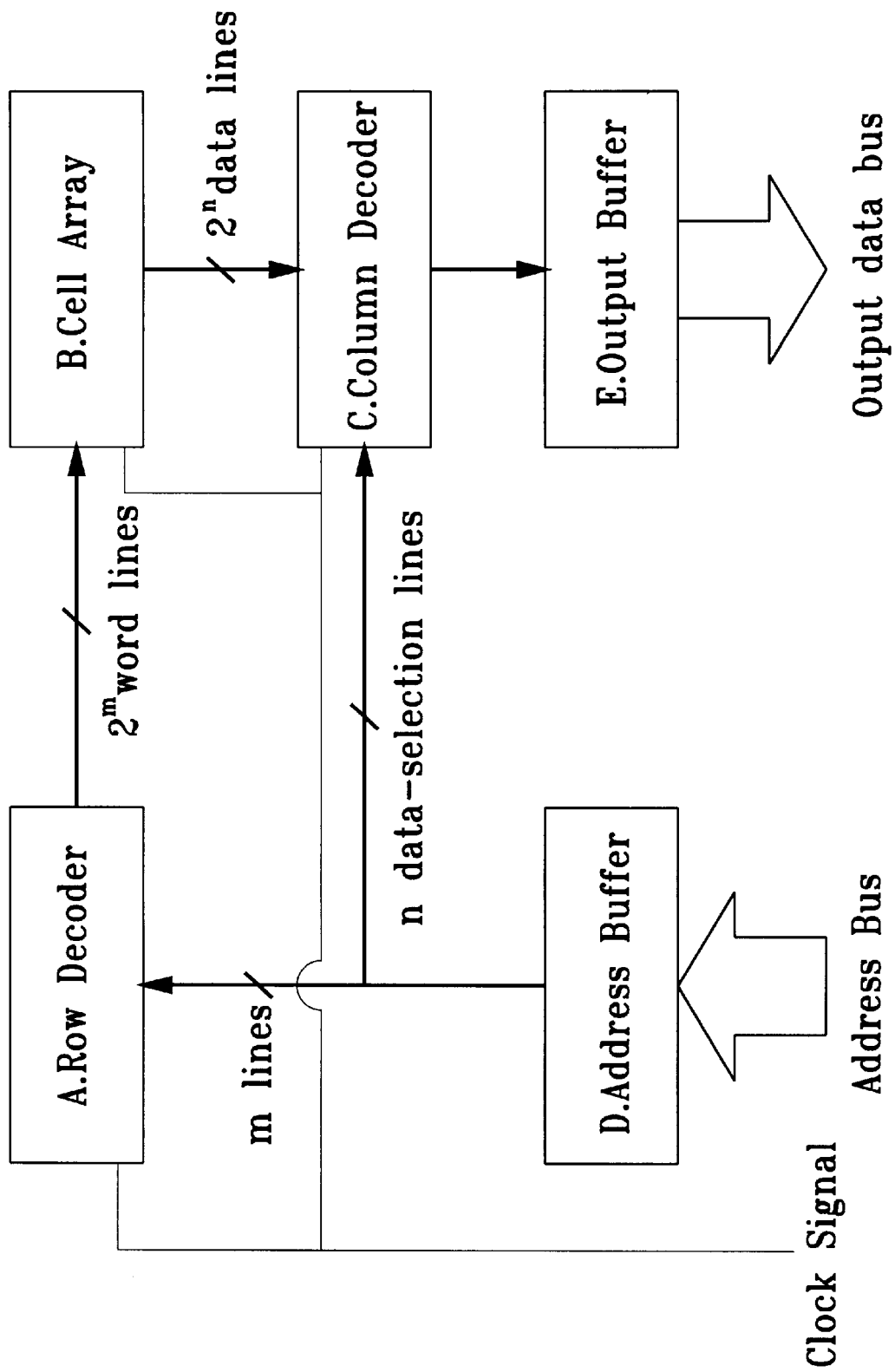
FIG. 1 is a circuit block diagram of an ordinary ROM.
Figure 2A:
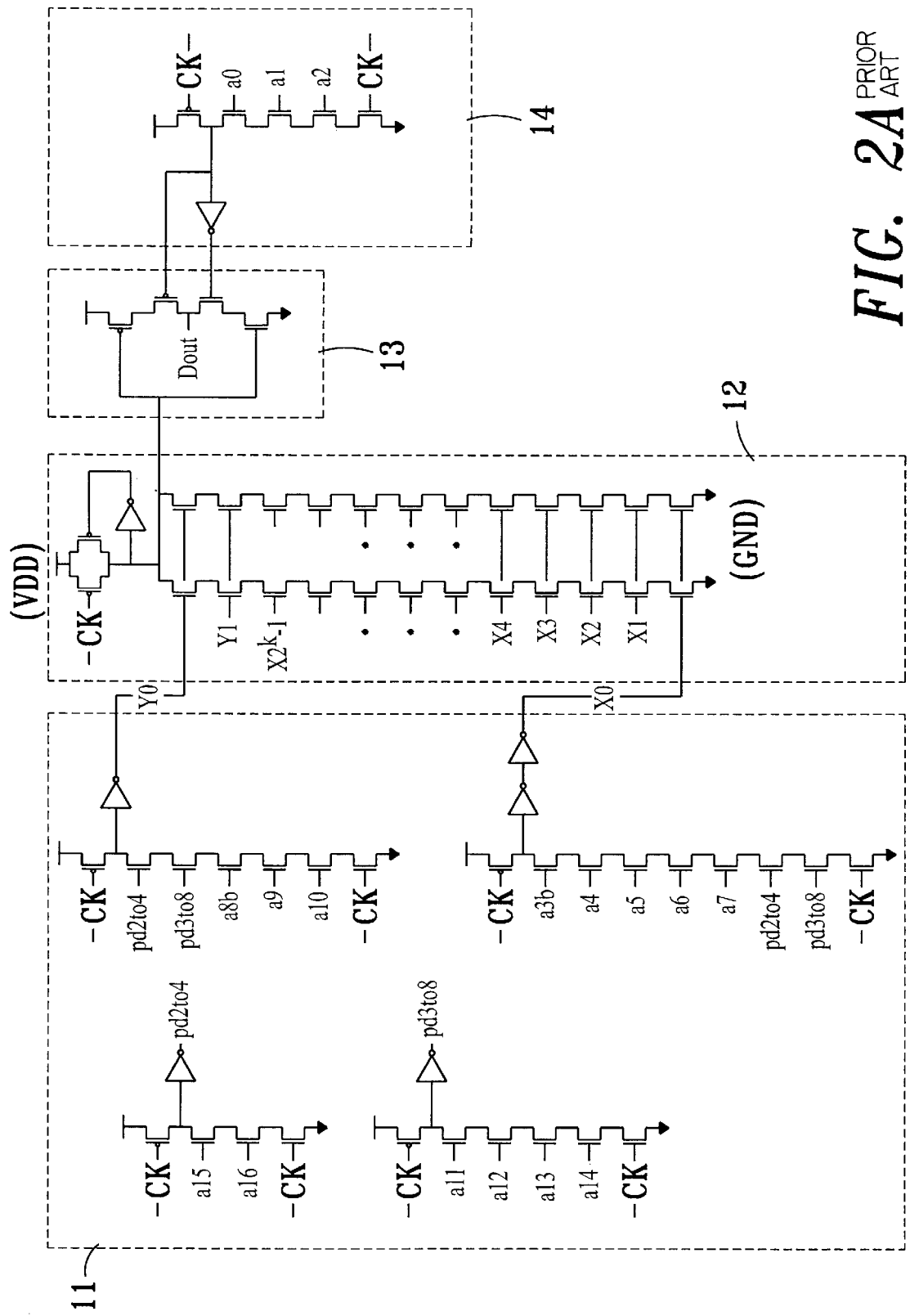
FIG. 2A is a partial schematic circuit of a conventional dynamic ROM.
Figure 2B:
FIG. 2B shows clock waveforms of a conventional dynamic ROM.
Figure 2B:
Figure 3A:
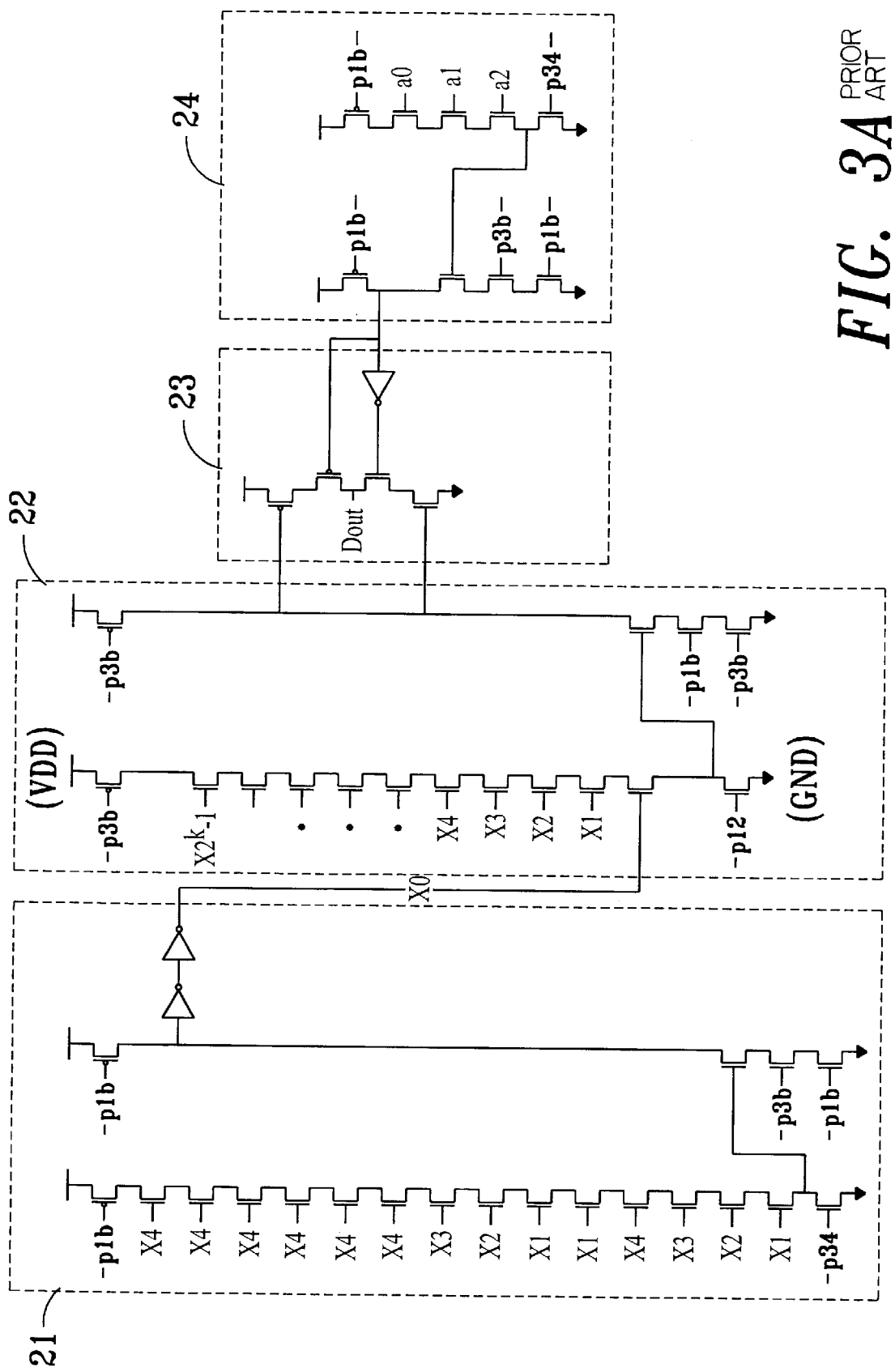
FIG. 3A is a schematic view of a meditating ROM structure with four-phase dynamic circuits.
Figure 3B:
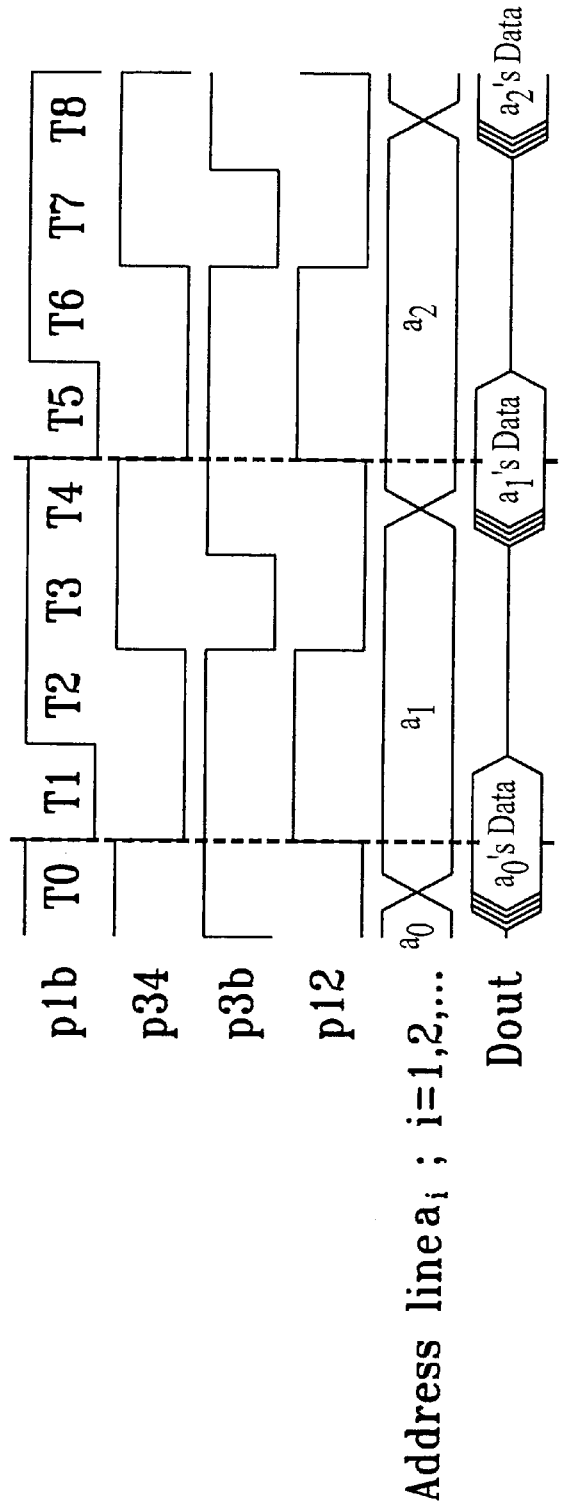
FIG. 3B shows a status table of circuit operation and waveforms of related timing control of a meditating ROM structure with four-phase dynamic circuits.

For a better understanding to function of the four-phase dynamic circuits in a ROM of the invention, we have layouted practically and circuit simulation by 0.6 $\mu$m SPTM fabricating process. The layout reveals that to move the output stage outside for common use of the memory cell array in the same column will not require a larger area. On the other hand, when loadings of word lines and data lines as well as effect of stray capacitance in common source/drain of the cascade N type transistors are put into consideration for circuit simulation, it is found that the operation speed and power dissipation of circuit 1 or 2 of the invention are far better than that of a conventional circuit. It is especially true for circuit 2 of the invention, which has lesser cascade transistors in its output stage. Table 1 and table 2 at different working voltages indicate performance differences between a conventional dynamic circuit (shown in FIG. 2A) and our four-phase dynamic circuit 2 (shown in FIG. 5A). In a conventional circuit, the clock waveform may be designed as shown in FIG. 2B, wherein the first one with 50% duty cycle usually serves as system clock too. This clock pulse seems lack of efficiency for the reason that the logic high interval may not suffice evaluation job while the logic low interval may exceeds too long over the expected precharge time.

The second one is much better but requisites an extra circuit for conversion a system clock into the required, which is used for performance assessment in this description. From table 1 and table 2, we understand:

TABLE 1

Comparison of the four-phase dynamic circuit to a conventional dynamic circuit for a ROM (5 V)

| CELL ARRAY Number of cascaded transistors N | Conventional dynamic circuit | | | Four-phase dynamic circuit | | |
|---|---|---|---|---|---|---|
| | Minimum Period | Power | Product of Period and Power | Minimum Period | Power | Product of Period and Power |
| 20 | 504.0 | 32.66 | 16.461 | 163.5 | 5.032 | 0.823 |
| 36 | 872.1 | 57.13 | 49.823 | 274.0 | 5.066 | 1.388 |
| 68 | 2128.2 | 113.2 | 240.912 | 1407.8 | 1.039 | 1.463 |

Unit:
(1) Minimum Period: ns
(2) Power: $\mu$W @ 167 KHz
(3) Product of Period and Power: pJ

TABLE 2

Comparison of the four-phase dynamic circuit to a conventional dynamic circuit for a ROM (3 V)

| CELL ARRAY Number of cascaded transistors N | Conventional dynamic circuit | | | Four-phase dynamic circuit | | |
|---|---|---|---|---|---|---|
| | Minimum Period | Power | Product of Period and Power | Minimum Period | Power | Product of Period and Power |
| 20 | 505.0 | 2.722 | 1.375 | 466.5 | 0.927 | 0.432 |
| 36 | 796.8 | 2.783 | 2.217 | 760.8 | 0.935 | 0.711 |
| 68 | 1819.0 | 3.465 | 6.302 | 1407.8 | 1.039 | 1.463 |

Unit:
(1) Minimum Period: ns
(2) Power: $\mu$W @ 100 KHz
(3) Product of Period and Power: pJ (1) The ROM with four-phase dynamic circuits having an operation speed of 3.09,3.182,3.94 (5 V) or 1.08,1.048, 1.29 (3 V) times that of a ROM with conventional dynamic circuits for the number of cascade transistors being 20, 36, and 68 respectively.

(2) The ROM with four-phase dynamic circuits dissipating power at 0.154,0.089,0.050 (5 V) or 0.341,0.336, 0.300 (3 V) times that of a ROM with conventional dynamic circuits for the number of cascade transistors being 20, 36, and 68 respectively.

(3) Since the data output from a memory cell array of a ROM with four-phase dynamic circuits being amplified by the output stage of memory cell array, wherein any change of number of cascade transistors in the array can scarcely influence stability of power dissipation.

(4) Table 1 indicating a product of period and power dissipation at 5 V and 68 pcs cascade transistors of a ROM with four-phase dynamic circuits, far lower to that of a ROM with conventional dynamic circuits, or only 1/79.483.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

References

[1] NEIL H. E. WESTE et al., "Principles of CMOS VLSI design : a systems perspective, first and second edition," Addison-Wesley Publishing Company, USA, October 1994.

[2] R. H. Krambeck et al., "High speed compact circuits with CMOS," IEEE JSSC, vol. sc-17, no. 3, June 1982, pp. 614–619.

[3] Chung-Yu W. et al., "Analysis and Design of a New Race-Free Four-Phase CMOS logic," IEEE JSSC, vol. 28, no. 1, pp. 18–25, January 1993.

[4] Hiroto Kawagoe et al., "Minimum Size ROM Structure Compatible with Silicon-Gate E/C MOS LSI," IEEE JSSC, vol. sc-11, no. 3, June 1976.

[5] Roger G. Stewart, "High-density CMOS ROM Arrays," IEEE JSSC, vol. sc-12, no. 5, October 1977.

[6] Tegze P. Haraszti, "Novel Circuits for High Speed ROM's ," IEEE JSSC, vol. sc-19, no. 2, April 1984.

[7] Fujio Masuoka et al., "An 80 ns 1 Mbit MASK ROM with a New Memory cell," IEEE JSSC, vol. sc-19, no. 5, October 1984.

[8] Harold L. Davis, "A 70-ns Word-Wide 1-Mbit ROM with On-Chip Error-Correction Circuits, " IEEE JSSC, vol. sc-20, no. 5, October 1985.

[9] Okada, M. et al., "A 16 Mb ROM Design Using Bank Select Architecture," VLSI Circuits Symposium, pp. 85–86, 1988.

[10] Barry R. L. et al., "A High-Performance ROM Compiler for 0.50 $\mu$m and 0.36 $\mu$m CMOS Technologies," ASIC Conference and Exhibit, 8th IEEE international, pp. 370–373, 1995.

[11] Duhalde M. et al., "A High Performance Modular Embedded ROM Architecture," Circuits and systems, IEEE International Symposium at Seattle Wash. USA, vol. 2, pp. 1057–1060, 1995.

[12] Yoshitaka Kitano et al., " A 4-Mbit Full-Wafer ROM," IEEE JSSC, vol. sc-15, no. 4, August 1980.

[13] Setsufumi Kamuro et al., "A 256K ROM Fabricated Using n-Well CMOS Process Technology," IEEE JSSC, vol. sc-17, no. 4, August 1982.

[14] Roger Cuppens et al., "A 256 kbit ROM with Serial ROM Memory cell Structure," IEEE JSSC, vol. sc-18, no. 3, June 1983.

[15] Shigeto Kohda et al., "A Giant Chip Multigate Transistor ROM Circuit Design," IEEE JSSC, vol. sc-21, no. 5, October 1986.

[16] Eiji Noguchi, "Developments in High-Density Mask ROM Technology," JST Reports, vol. 3, no. 1 Spring 1987.

[17] Yasuo Neruke et al., "A 16 Mb Mask ROM with Programmable Redundancy," ISSCC 89, Session 10, Non-volatile Memories, Paper THAM 10.1, pp. 28–129, 311, 1989.

[18] Wu; Chung-Yu and Cheng; Kuo-Hsing, "CMOS dynamic logic structure," 5378942, Appl. No. 71523, U.S.A. Patent, Jun. 3, 1993.

[19] Herdt; Christian E., Cliadakis; Steven H., "Nand stack ROM," 4980861, Appl. No. 287570, U.S.A. Patent, Dec. 16, 1988.

[20] Pascucci; Luigi, "Row decoder for NAND-type ROM," 5347493, Appl. No. 938731, U.S.A. Patent, Aug. 31, 1992.

[21] M. Momodomi et al., "A Experimental 4-Mbit CMOS EEPROM with a NAND-structure memory cell," IEEE J. Solid-state Circuits, vol. 24, No. 5, pp. 1238–1243, November 1989.

[22] Y. Iwata et al., "A High-Density NAND EEPROM with Block-Page Programming for Microconputer Applications," IEEE J. Solid-State Circuit, vol. 25, No. 2, April 1990.

[23] M. Momodomi et al., "A 4-Mb NAND EEPROM with Tight programmed Vt Distribution," IEEE J. Solid-State Circuits, vol. 26, No. 4, April 1991.

[24] Y. Iwata et al., "A 35 ns-cycle-time 3.3 V-only 32 Mb NAND flash EEPROM," IEEE J. Solid-State Circuits, vol. 30, pp. 1157–1164, November 1995.

[25] K. D. Suh et al., "A 3.3 V 32 MB NAND Flash memory with incremental step pulse programming scheme," IEEE J. Solid-State Circuits, vol. 30, pp. 1149–1156, November 1995.

[26] T. S. Jung et al., "A 117-mm$^2$ 3.3 V only 128-Mb multilevel NAND Flash memory for mass storage applications," IEEE J. Solid-State Circuits, vol. 31, pp. 1575–1583, November 1996.

[27] Jin-Ki Kim et al., "A 120-mm$^2$ 64-Mb NAND Flash Memory Achieving 180 ns/Byte Effective Program Speed," IEEE J. Solid-State Circuits, vol. 32, No. 5, May 1997.

[28] Tae-Sung Jung et al., "A 3.3-V Single Power Supply 16-Mb Nonvolatile Virtual DRAM Using a NAND Flash Memory Technology," IEEE J. Solid-State Circuits, vol. 32, No. 11, November 1997.

What is claimed is:

1. A ROM comprising four-phase dynamic circuits, including a row decoder and a column decoder constructed with pseudo-domino dynamic circuits, and a memory cell array constructed with high-speed precharge-discharge CMOS concept circuits, said dynamic circuits operating cyclically in sequence of four phases comprising:

during first phase, said row an column decoders being under precharge state while said memory cell array under discharge/hold state;

during second phase, said row and column decoders being under evaluation state while said memory cell array still under discharge/hold state;

during third phase, said row and column decoders being still under evaluation state while said memory cell array entering precharge state; and during fourth phase, said row and column decoders being still under evaluation state, and said memory cell array entering evaluation state too.

2. The dynamic circuits operating cyclically in sequence of four phases according to claim 1, wherein logic state of address lines are changed at said first phase and stabilized before end thereof; and logic state of data lines are changed at said fourth phase and stabilized before end thereof.

* * * * *